(12) United States Patent
Otake et al.

(10) Patent No.: US 8,134,180 B2
(45) Date of Patent: Mar. 13, 2012

(54) NITRIDE SEMICONDUCTOR DEVICE WITH A VERTICAL CHANNEL AND METHOD FOR PRODUCING THE NITRIDE SEMICONDUCTOR DEVICE

(75) Inventors: Hirotaka Otake, Kyoto (JP); Shigefusa Chichibu, Sendai (JP)

(73) Assignee: Rohm Co., Ltd., Kyoto (JP)

( * ) Notice: Subject to any disclaimer, the term of this patent is extended or adjusted under 35 U.S.C. 154(b) by 486 days.

(21) Appl. No.: 12/222,462

(22) Filed: Aug. 8, 2008

(65) Prior Publication Data

US 2009/0057684 A1  Mar. 5, 2009

(30) Foreign Application Priority Data

Aug. 9, 2007 (JP) ................. 2007-208389

(51) Int. Cl.
*H01L 29/66* (2006.01)
*H01L 21/02* (2006.01)
*H01L 21/338* (2006.01)

(52) U.S. Cl. ........ 257/192; 257/194; 257/196; 257/279; 257/280; 257/329; 257/E29.255; 257/E21.403; 438/167; 438/168; 438/172; 438/173; 438/179

(58) Field of Classification Search ...................... 257/76
See application file for complete search history.

(56) References Cited

U.S. PATENT DOCUMENTS

| | | | |
|---|---|---|---|
| 7,589,360 B2 * | 9/2009 | Matocha et al. | 257/192 |
| 2005/0258450 A1 * | 11/2005 | Saxler | 257/192 |
| 2006/0138457 A1 * | 6/2006 | Otsuka et al. | 257/194 |
| 2006/0219997 A1 * | 10/2006 | Kawasaki et al. | 257/12 |
| 2008/0001165 A1 * | 1/2008 | Hashimoto et al. | 257/103 |
| 2008/0116486 A1 * | 5/2008 | Saito et al. | 257/192 |
| 2008/0128862 A1 * | 6/2008 | Sugimoto et al. | 257/615 |
| 2008/0203471 A1 * | 8/2008 | Otake et al. | 257/329 |
| 2010/0078688 A1 * | 4/2010 | Otake et al. | 257/288 |

FOREIGN PATENT DOCUMENTS

WO   WO2008/090788   * 7/2008

OTHER PUBLICATIONS

Kanechika, Masakazu et al., "A Vertical Insulated Gate AlGaN/GaN Heterojunction Field-Effect Transistor" Japanese Journal of Applied Physics, vol. 46, No. 21, pp. L503-L505, 2007.

* cited by examiner

*Primary Examiner* — N Drew Richards
*Assistant Examiner* — Michael Jung
(74) *Attorney, Agent, or Firm* — Rabin & Berdo, PC

(57) ABSTRACT

A nitride semiconductor device includes: a semiconductor base layer made of a conductive group III nitride semiconductor having a principal plane defined by a nonpolar plane or a semipolar plane; an insulating layer formed on the principal plane of the semiconductor base layer with an aperture partially exposing the principal plane; a nitride semiconductor multilayer structure portion, formed on a region extending onto the insulating layer from the aperture, having a parallel surface parallel to the principal plane of the semiconductor base layer as well as a +c-axis side first inclined surface and a −c-axis side second inclined surface inclined with respect to the principal plane of the semiconductor base layer and including two types of group III nitride semiconductor layers at least having different lattice constants; a gate electrode formed to be opposed to the second inclined surface; a source electrode arranged to be electrically connected with the group III nitride semiconductor layers; and a drain electrode formed on a back surface of the semiconductor base layer opposite to the principal plane.

16 Claims, 6 Drawing Sheets

NITRIDE SEMICONDUCTOR DEVICE WITH A VERTICAL CHANNEL AND METHOD FOR PRODUCING THE NITRIDE SEMICONDUCTOR DEVICE

BACKGROUND OF THE INVENTION

1. Field of the Invention

The present invention relates to a nitride semiconductor device employing a group III nitride semiconductor and a method for producing the same.

2. Description of Related Art

Conventionally, the so-called CAVET (Current Aperture Vertical Electron Transistor) is known as a vertical transistor employing two-dimensional electron gas resulting from a semiconductor heterojunction as a channel such as an HEMT (High Electron Mobility Transistor).

Figure 3:
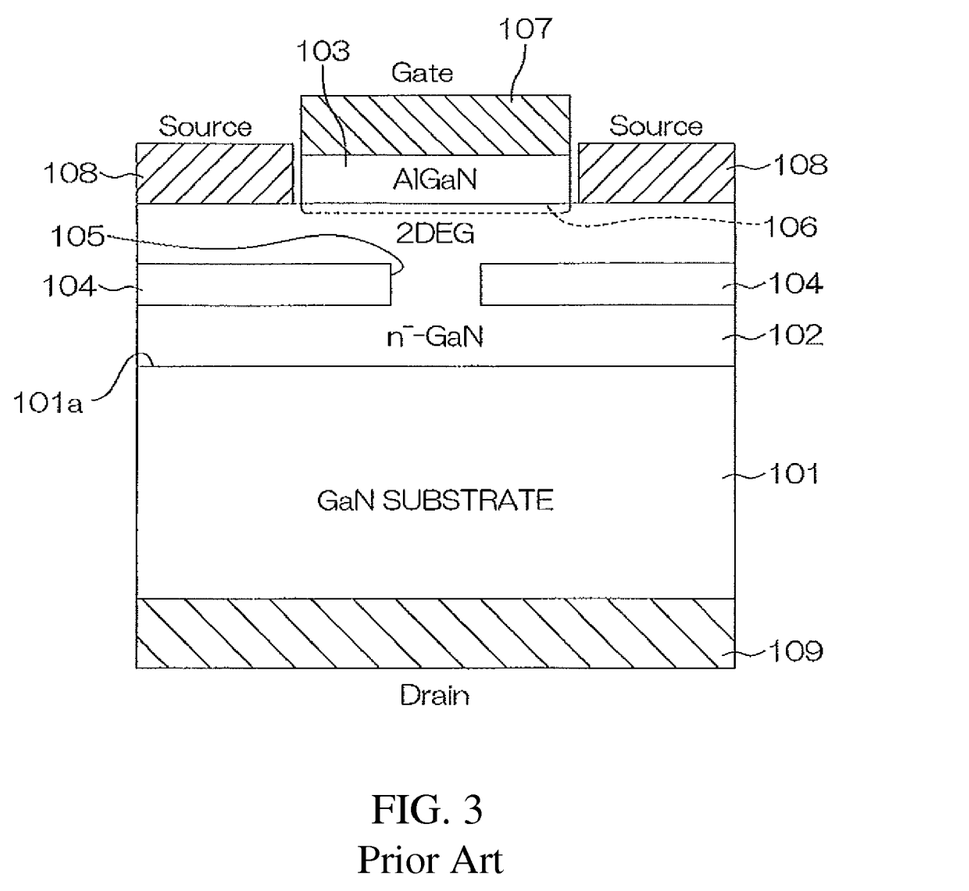
FIG. 3 is a schematic sectional view of a conventional CAVET.

FIG. 3 is a schematic sectional view of a conventional CAVET.

This CAVET includes a GaN (gallium nitride) substrate 101, a high-resistance layer (an n⁻-type GaN (gallium nitride) layer 102 in FIG. 3) having a low n-type impurity concentration stacked on a principal growth plane 101a of the GaN substrate 101 and a layer (an AlGaN (aluminum gallium nitride) layer 103 in FIG. 3, for example), having a different lattice constant from the n⁻-type GaN layer 102, laminated on the n⁻-type GaN layer 102, for example. In other words, the n⁻-type GaN layer 102 and the AlGaN layer 103 are successively epitaxially grown in order on the GaN substrate 101 with the interface parallel to the principal growth plane 101a.

A p-type GaN layer 104 provided with an opening 105 on a position opposed to the AlGaN layer 103 is formed on an intermediate portion of the n⁻-type GaN layer 102 in the thickness direction.

In the vicinity of the interface between a portion located above the p-type GaN layer 104 and the AlGaN layer 103, two-dimensional electron gas 106 parallel to the principal growth plane 101a is formed in the n⁻-type GaN layer 102 due to the heterojunction therebetween.

A gate electrode 107 is formed on the AlGaN layer 103, to form a Schottky junction with the AlGaN layer 103. Two source electrode 108 are formed to be opposed to each other through the gate electrode 107, to form ohmic contact with the AlGaN layer 103 or the n⁻-type GaN layer 102.

A drain electrode 109 is formed on the back surface of the GaN substrate 101 opposite to the principal growth plane 101a, to form ohmic contact with the GaN substrate 101.

Thus, the source electrodes 108 and the drain electrode 109 are opposed to each other through the GaN substrate 101, to constitute the CAVET having a vertical structure.

When a bias voltage positive on the drain side is applied between the source and the drain in the CAVET having the aforementioned vertical structure, a potential difference is caused between the source and the drain, and a current flows from the drain electrode 109 to the source electrode 108. More specifically, when the bias voltage is applied between the source and the drain, the two-dimensional electron gas 106 moves due to the potential difference therebetween, and electrons reach the opening 105 of the p-type GaN layer 104.

The electrons reaching the opening 105 flow in the n⁻-type GaN layer 102 through the opening 105 to flow into the GaN substrate 101, due to the potential of the drain electrode 109. The electrons flowing into the GaN substrate 101 reach the drain electrode 109 through the GaN substrate 101.

Thus, the current flows from the drain electrode 109 to the source electrode 108, to allow the source and the drain to conduct.

However, the aforementioned CAVET capable of implementing the vertical structure has the so-called normally-on characteristic with a gate threshold voltage $V_{th}$ of $-16$ V. In order to turn off the CAVET, therefore, a negative voltage must be applied to the gate electrode 107, to pinch off the two-dimensional electron gas 106.

Therefore, the principal growth plane 101a of the GaN substrate 101 may be defined by a nonpolar plane (an a-plane or an m-plane). When the principal growth plane 101a of the GaN substrate 101 is defined by a nonpolar plane, the two-dimensional electron gas 106 formed in the n⁻-type GaN layer 102 parallel to the nonpolar plane is utilized.

However, no remarkable polarization takes place on the nonpolar plane, and hence the two-dimensional electron gas 106 has a low electron density. This leads to such another disadvantage that the channel mobility of the CAVET is reduced, although the CAVET approaches the so-called normally-off characteristic with the gate threshold voltage $V_{th}$ exhibiting a positive value.

SUMMARY OF THE INVENTION

An object of the present invention is to provide a normally-off type nitride semiconductor device and a method for producing the same.

A nitride semiconductor device of the present invention includes: a semiconductor base layer made of a conductive group III nitride semiconductor having a principal plane defined by a nonpolar plane or a semipolar plane; an insulating layer formed on the principal plane of the semiconductor base layer with an aperture partially exposing the principal plane; a nitride semiconductor multilayer structure portion, formed on a region extending onto the insulating layer from the aperture, having a parallel surface parallel to the principal plane of the semiconductor base layer as well as a +c-axis side first inclined surface and a -c-axis side second inclined surface inclined with respect to the principal plane of the semiconductor base layer and including two types of group III nitride semiconductor layers at least having different lattice constants; a gate electrode formed to be opposed to the second inclined surface; a source electrode arranged to be electrically connected with the group III nitride semiconductor layers; and a drain electrode formed on a back surface of the semiconductor base layer opposite to the principal plane.

According to this structure, the insulating layer having the aperture partially exposing the principal plane (nonpolar or semipolar plane) of the semiconductor base layer is formed on the principal plane of the semiconductor base layer. The nitride semiconductor multilayer structure portion, made of group III nitride semiconductors, having the parallel surface, the first inclined surface and the second inclined surface is formed on the region extending onto the insulating layer from the aperture of the insulating layer. The nitride semiconductor multilayer structure portion includes the two types of group III nitride semiconductor layers at least having different lattice constants. The gate electrode is opposed to the second inclined surface of the nitride semiconductor multilayer structure portion. The two types of group III nitride semiconductor layers having different lattice constants are electrically connected with the source electrode. The drain electrode is formed on the back surface of the semiconductor base layer opposite to the principal plane thereof, and electrically connected with the semiconductor base layer.

In one of the two types of group III nitride semiconductor layers having different lattice constants, two-dimensional electron gas is formed in the vicinity of the interface therebetween due to the heterojunction of these layers. In the nitride semiconductor device, this two-dimensional electron gas is employed as a current channel. Thus, the source electrode and the drain electrode are opposed to each other through the semiconductor base layer, to constitute a vertical nitride semiconductor device (CAVET: Current Aperture Vertical Electron Transistor).

The group III nitride semiconductors constituting the semiconductor base layer and the nitride semiconductor multi player structure portion can be generally expressed as $Al_x In_y Ga_{1-x-y} N$ ($0 \leq x \leq 1$, $0 \leq y \leq 1$ and $0 \leq x+y \leq 1$) respectively. Among the group III nitride semiconductors expressed in this manner, the conductive group III nitride semiconductor employed for the semiconductor base layer can be prepared from GaN (gallium nitride) or InN (indium nitride), for example. As the two types of group III nitride semiconductor layers having different lattice constants, a GaN layer and an AlGaN layer, for example, can be combined with each other. Alternatively, an AlGaN layer and another AlGaN layer may be combined with each other, so far as the AlGaN layers have different lattice constants.

As the two types of group III nitride semiconductor layers having different lattice constants, further, semiconductor layers of the same composition formed by modulation doping varying impurity concentrations may be combined with each other.

When the source electrode is formed on the group III nitride semiconductor layer corresponding to the outermost layer of the nitride semiconductor multilayer structure portion, the surface of the group III nitride semiconductor layer on which the source electrode is formed is preferably the parallel surface of the nitride semiconductor multilayer structure portion.

When one of the two types of group III nitride semiconductor layers having different lattice constants is a GaN layer, this GaN layer can be formed by an i-type GaN layer containing no impurity, a high-resistance layer containing Fe (iron) or the like or a high-resistance $n^-$-type GaN layer containing an impurity in a low concentration, for example.

In this nitride semiconductor device, the gate electrode is opposed to the second inclined surface of the nitride semiconductor multilayer structure portion, whereby a depletion layer can spread from this gate electrode into the nitride semiconductor multilayer structure portion. Thereafter, a proper value is set to the thickness of the layer on the side of the second inclined surface in the layer forming the two-dimensional electron gas and the layer closer to the surface layer of the nitride semiconductor multilayer structure portion. Due to the depletion layer spreading in the nitride semiconductor multilayer structure portion, it is possible to annihilate (pinch off) the two-dimensional electron gas formed in the vicinity of the interface between the group III nitride semiconductor layers.

The principal plane of the semiconductor base layer is defined by a nonpolar or semipolar plane, whereby threading dislocations (spiral dislocations, for example) in the c-axis direction present in the semiconductor base layer parallelly or inclinatorily extend with respect to the principal plane of the semiconductor base layer. When the nitride semiconductor multilayer structure portion is formed by epitaxially growing the group III nitride semiconductors from the principal plane of the semiconductor base layer, for example, transfer of the threading dislocations from the semiconductor base layer to the nitride semiconductor multilayer structure portion can be suppressed. Therefore, the threading dislocations in the semiconductor base layer can be prevented from generating a leakage current, whereby the device characteristics of the nitride semiconductor device can be improved.

Further, the second inclined surface opposed to the gate electrode is defined by a plane of the −c-axis side inclined with respect to the principal plane of the semiconductor base layer.

Comparing the growth rates of a group III nitride semiconductor in the +c-axis direction and the −c-axis direction with each other, the former is higher than the latter. When the nitride semiconductor multilayer structure portion is formed by forming a mask having an aperture partially exposing the principal plane of the semiconductor base layer on the principal plane and growing the group III nitride semiconductor layers from the aperture of the mask, therefore, an interface parallel to the second inclined surface can be positioned closer to the aperture of the mask than an interface parallel to the first inclined surface. In this case, the mask employed for growing the group III nitride semiconductor layers can be utilized as the insulating layer.

The operation of the nitride semiconductor device is now described. In order to operate this nitride semiconductor device, a bias voltage positive on the drain side is applied between the source and the drain. In this nitride semiconductor device, the depletion layer spreading from the gate electrode pinches off the two-dimensional electron gas (channel portion) on the side of the second inclined surface, as hereinabove described.

When the interface parallel to the second inclined surface is positioned closer to the aperture of the insulating layer than the interface parallel to the first inclined surface and one of the two types of group III nitride semiconductor layers having different lattice constants is an i-type or high-resistance $n^-$-type GaN layer, electrons in the two-dimensional electron gas on the side of the first inclined surface do not flow into the semiconductor base layer through the GaN layer.

When the two-dimensional electron gas on the side of the second inclined surface is pinched off, therefore, the source and the drain are cut off from each other. When a bias voltage of not less than a prescribed value (gate threshold voltage) positive with reference to the potential of the source electrode is applied to the gate electrode from this state, the two-dimensional electron gas is released from the pinch-off state.

When released from the pinch-off state, the two-dimensional electron gas moves and electrons reach a portion around an edge of the aperture of the insulating layer closer to the second inclined surface. The electrons reaching the portion around the edge of the aperture closer to the second inclined surface flow in the group III nitride semiconductor layers located in the aperture due to the potential of the drain electrode, to flow into the semiconductor base layer.

Then, the electrons reach the drain electrode through the semiconductor base layer, to allow the source and the drain to conduct.

Thus, the source and the drain are allowed to conduct when a bias voltage is applied to the gate electrode while the source and the drain are cut off from each other when no bias voltage is applied to the gate electrode, to achieve a normally-off operation.

The second inclined surface is inclined with respect to the principal plane (nonpolar or semipolar plane) of the semiconductor base layer, whereby the surface parallel to the second inclined surface is polarized. Therefore, the part of the two-dimensional electron gas along the second inclined surface can be inhibited from reduction in electron density. Consequently, the nitride semiconductor device can be inhibited from reduction in channel mobility.

The semiconductor base layer may include an m-plane GaN substrate having a principal plane defined by an m-plane or an a-plane GaN substrate having a principal plane defined by an a-plane. In the m-plane GaN substrate or the a-plane GaN substrate, threading dislocations (spiral dislocations, for example) in the c-axis direction present in the substrate extend parallelly to the principal plane (m- or a-plane). When the semiconductor base layer is formed by an m-plane GaN substrate or an a-plane GaN substrate, therefore, even if the nitride semiconductor multilayer structure portion is formed by epitaxy, for example, transfer of the threading dislocations from the GaN substrate to the nitride semiconductor multilayer structure portion can be further suppressed.

Preferably, the second inclined surface is defined by a −c-plane. When the second inclined surface is defined by a −c-plane (polar plane), the electron density of the part of the two-dimensional electron gas along the second inclined surface can be further increased, whereby a nitride semiconductor device having excellent channel mobility can be implemented.

Preferably, the nitride semiconductor device further includes a passivation film made of SiN formed in contact with the surface of the nitride semiconductor multilayer structure portion.

According to this structure, the passivation film made of SiN is formed in contact with the surface of the nitride semiconductor multilayer structure portion, whereby surface charge of the nitride semiconductor multilayer structure portion can be suppressed. Consequently, the quantity of trap levels on the surface of the nitride semiconductor multilayer structure portion can be reduced, whereby current collapse can be suppressed.

Preferably, SiN is interposed between the second inclined surface and the gate electrode in the nitride semiconductor device.

According to this structure, SiN is so interposed between the second inclined surface and the gate electrode that the nitride semiconductor device has the so-called MIS (Metal Insulator Semiconductor) structure. When the nitride semiconductor device has the MIS structure, surface charge (interface charge) around the interface between the nitride semiconductor multilayer structure portion and SiN can be suppressed. Consequently, current collapse as well as generation of a leakage current can be suppressed.

Preferably, a portion of the interface between the two types of group III nitride semiconductor layers at least having different lattice constants parallel to the second inclined surface is positioned closer to the aperture than a portion, included in the interface, parallel to the first inclined surface.

Preferably, the nitride semiconductor multilayer structure portion has a mesa shape including an upper wall parallel to the principal plane of the semiconductor base layer and sidewalls of a +c-axis side and a −c-axis side inclined with respect to the principal plane of the semiconductor base layer, and in this case, the surface of the upper wall forms the parallel surface, the sidewall of the +c-side side forms the first inclined surface, and the sidewall of the −c-axis side forms the second inclined surface.

Preferably, the two types of group III nitride semiconductor layers at least having different lattice constants are in a multilayer structure of an $n^-$-type GaN layer provided on the side of the semiconductor base layer and an $n^+$-type AlGaN layer having a different lattice constant from the $n^-$-type GaN layer.

Preferably, the insulating layer is made of an oxide, a nitride or an oxynitride in the nitride semiconductor device.

A method for producing a nitride semiconductor device of the present invention includes the steps of: forming an insulating layer having an aperture partially exposing a principal plane of a semiconductor base layer on the principal plane, defined by a nonpolar plane or a semipolar plane, of the semiconductor base layer made of a conductive group III nitride semiconductor; growing two types of group III nitride semiconductor layers at least having different lattice constants from the aperture successively from the side of the principal plane of the semiconductor base layer through the insulating layer employed as a mask and stopping the growth when a mesa structure having a parallel surface parallel to the principal plane of the semiconductor base layer as well as a first inclined surface of a+c-axis side and a second inclined surface of a −c-axis side inclined with respect to the principal plane of the semiconductor base layer is formed on a region of the insulating layer; forming a gate electrode to be opposed to the second inclined surface; forming a source electrode to be electrically connected with the group III nitride semiconductor layers; and forming a drain electrode on a back surface of the semiconductor base layer opposite to the principal plane.

Comparing the growth rates of a group III nitride semiconductor in the +c-axis direction and the −c-axis direction with each other, the former is higher than the latter, as hereinabove described. If the growth of the group III nitride semiconductor layers is stopped when the mesa structure having the parallel surface, the first inclined surface of the +c-axis side and the second inclined surface of the −c-axis side is formed on the region of the insulating layer as in this method, therefore, such a nitride semiconductor multilayer structure that a portion of an interface between the two types of group III nitride semiconductor layers having different lattice constants parallel to the second inclined surface is positioned closer to an aperture of the insulating layer than portion, included in the interface, parallel to the first inclined surface is obtained. In other words, the aforementioned nitride semiconductor device can be prepared according to this method through the difference between the growth rates of the group III nitride semiconductors in the +c-axis direction and the −c-axis direction.

The foregoing and other objects, features and effects of the present invention will become more apparent from the following detailed description of the preferred embodiments with reference to the attached drawings.

DETAILED DESCRIPTION OF THE INVENTION

Figure 1:
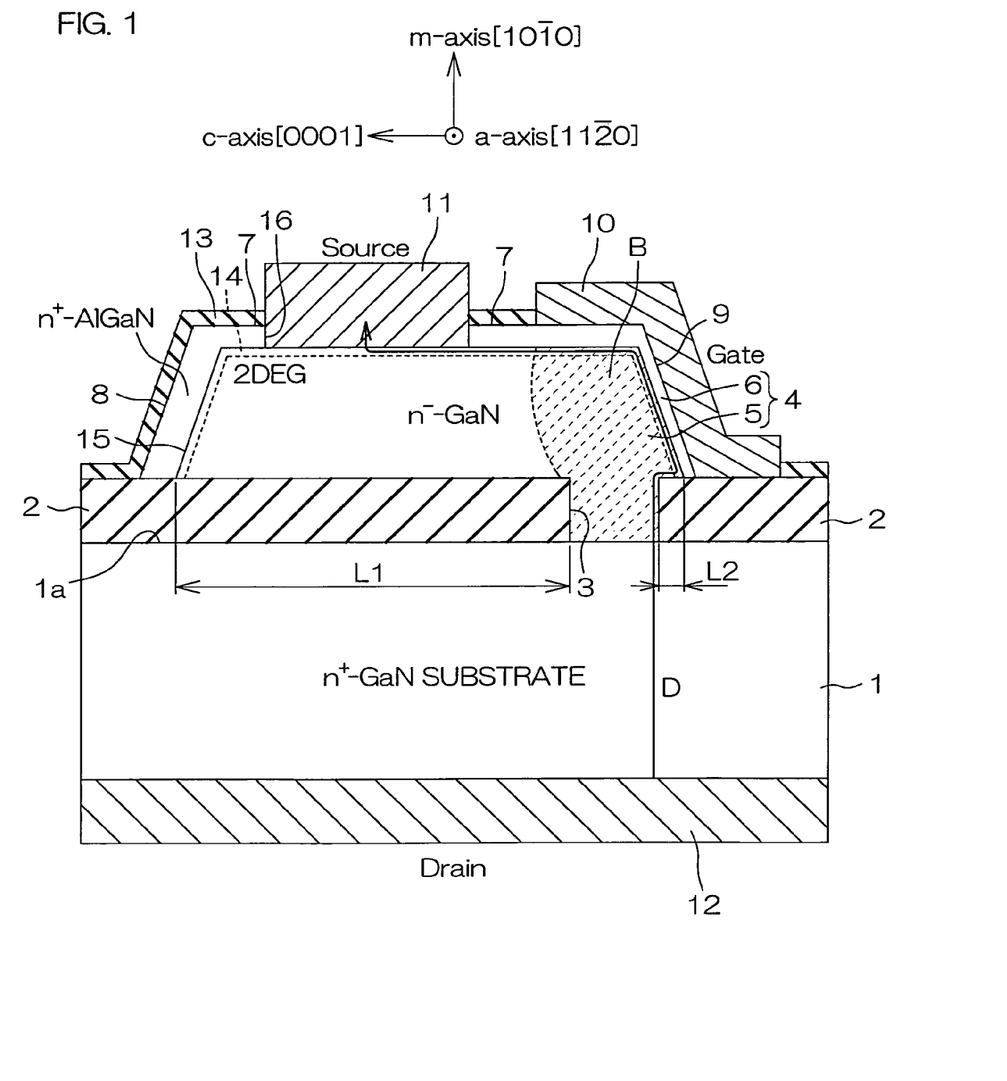
FIG. 1 is a schematic sectional view of a CAVET according to an embodiment of the present invention.

FIG. 1 is a schematic sectional view of a CAVET according to an embodiment of the present invention.

This CAVET (Current Aperture Vertical Electron Transistor) is a kind of HEMT (High Electron Mobility Transistor) employing two-dimensional electron gas resulting from a semiconductor heterojunction as a current channel, and used as a low-noise amplifier loaded on an antenna for receiving satellite broadcasting, a car navigation system or the like, for example.

Referring to FIG. 1, the CAVET includes an $n^+$-type GaN substrate 1 (semiconductor base layer), an insulating film 2 (insulating layer) formed on a principal plane 1a of this $n^+$-type GaN substrate 1 with an aperture 3 partially exposing the principal plane 1a, and a nitride semiconductor multilayer structure portion 4 formed on a region extending onto the insulating film 2 from the aperture 3 of the insulating film 2.

The principal plane 1a of the n$^+$-type GaN substrate 1 is defined by a nonpolar plane or a semipolar plane, more specifically, a nonpolar plane such as an m-plane (10-10) or an a-plane (11-20) or a semipolar plane such as (10-13), (10-11) or (11-22). This plane orientation is selected in response to the types of group III nitride semiconductors crystal-grown from the principal plane 1a. According to this embodiment, the principal plane 1a of the n$^+$-type GaN substrate 1 is defined by an m-plane. The n$^+$-type GaN substrate 1 has a high n-type impurity concentration of $1\times10^{18}$ cm$^{-3}$ to $5\times10^{18}$ cm$^{-3}$, for example.

The insulating film 2 is in the form of a plurality of (two in FIG. 1) stripes extending in the a-axis direction, and these stripes hold the aperture 3 partially exposing the principal plane 1a of the n$^+$-type GaN substrate 1 therebetween.

The insulating film 2 can be prepared from an oxide, a nitride or an oxynitride such as SiO$_2$ (silicon oxide), Ga$_2$O$_3$ (gallium oxide), MgO (magnesium oxide), Sc$_2$O$_3$ (scandium oxide), SiN (silicon nitride), SiON (silicon oxynitride) or the like, for example. Among these materials, SiO$_2$ is employed in this embodiment. When the insulating film 2 is prepared from an oxide, a nitride or an oxynitride, stress on the group III nitride semiconductors grown from the principal plane 1a of the n$^+$-type GaN substrate 1 can be controlled. Therefore, cracks in the group III nitride semiconductors can be suppressed. Further, the insulating film 2 can be relatively easily formed by lithography or etching.

The thickness of the insulating film 2 is 50 nm to 500 nm, for example. This thickness is preferably changed to the optimum value in response to the area of the aperture 3 or the thickness of an n$^-$-type GaN layer 5 described later. The opening width of the aperture 3 (width in the c-axis direction) is 1 μm to 10 μm, for example.

The nitride semiconductor multilayer structure portion 4 has an upper wall parallel to the principal plane 1a of the n$^+$-type GaN substrate 1 and sidewalls of the +c-axis side and the −c-axis side inclined with respect to the principal plane 1a on the region extending onto the insulating film 2 from the aperture 3 of the insulating film 2. The nitride semiconductor multilayer structure portion 4 is mesa-shaped in sectional view.

In plan view, on the other hand, the nitride semiconductor multilayer structure portion 4 is in the form of stripes extending in the a-axis direction, similarly to the insulating film 2. In this nitride semiconductor multilayer structure portion 4, the surface of the upper wall forms a parallel surface 7 parallel to the principal plane 1a, the surface of the sidewall on the +c-axis side forms a +c-axis side inclined surface 8 (first inclined surface), and the surface of the sidewall on the −c-axis side forms a −c-axis side inclined surface 9 (second inclined surface). The +c-axis side inclined surface 8 and the −c-axis side inclined surface 9 inclined with respect to the principal plane 1a (m-plane) are defined by semipolar planes such as (10-13), (10-11) or (11-22), for example.

More specifically, the nitride semiconductor multilayer structure portion 4 includes the n$^-$-type GaN layer 5 and an n$^+$-type AlGaN layer 6 having a different lattice constant from the n$^-$-type GaN layer 5.

The n$^-$-type GaN layer 5 and the n$^+$-type AlGaN layer 6 are laminated in this order through an interface 15 parallel to the parallel surface 7 (m-plane), the +c-axis side inclined surface 8 and the −c-axis side inclined surface 9 of the nitride semiconductor multilayer structure portion 4. In other words, the lower n$^-$-type GaN layer 5 is mesa-shaped in section, with an upper wall parallel to the upper wall of the nitride semiconductor multilayer structure portion 4 and sidewalls parallel to the sidewalls of the +c-axis side and the −c-axis side.

On the other hand, the upper n$^+$-type AlGaN layer 6 has an upper wall in contact with the upper wall of the n$^-$-type GaN layer 5 and sidewalls in contact with the sidewalls of the n$^-$-type GaN layer 5. Further, the n$^+$-type AlGaN layer 6 forms the outermost layer of this multilayer structure, and hence the surface (upper surface) of the upper wall and the surfaces (side surfaces) of the sidewalls thereof form the parallel surface 7 (m-plane), the +c-axis side inclined surface 8 and the −c-axis side inclined surface 9 of the nitride semiconductor multilayer structure portion 4 respectively.

The thickness of the n$^-$-type GaN layer 5 is 1 μm to 2 μm, for example. On the other hand, the thickness (in the m-axis direction) of the upper wall of the n$^+$-type AlGaN layer 6 is 10 nm to 30 nm, for example. The thickness of the sidewall on the +c-axis side is 10 nm to 30 nm, for example. The thickness of the sidewall on the −c-axis side is 10 nm to 30 nm, for example.

In the nitride semiconductor multilayer structure portion 4, a portion of the interface 15 (GaN/AlGaN interface) between the n$^-$-type GaN layer 5 and the n$^+$-type AlGaN layer 6 on the −c-axis side is positioned closer to the aperture 3 than a portion on the +c-axis side. More specifically, the distance L1 between the lower end of the portion of the interface 15 on the +c-axis side in the m-axis direction and an end of the aperture 3 of the insulating film 2 on the +c-axis side is larger than the distance L2 between the lower end of the portion of the interface 15 on the −c-axis side in the m-axis direction and an end of the aperture 3 of the insulating film 2 on the −c-axis side. The distances L1 and L2 are 1 μm to 100 μm and 0.1 μm to 10 μm respectively, for example. These distances L1 and L2 are properly selected in response to the types of the group III nitride semiconductors constituting the nitride semiconductor multilayer structure portion 4.

In the n$^-$-type GaN layer 5, two-dimensional electron gas 14 (2DEG) is formed around the interface 15 (GaN/AlGaN interface). This two-dimensional electron gas 14 results from the heterojunction of the n$^-$-type GaN layer 5 and the n$^+$-type AlGaN layer 6, and is present generally over a region of the n$^-$-type GaN layer 5 around the interface 15 in the nitride semiconductor multilayer structure portion 4. In this CAVET, this two-dimensional electron gas 14 is employed as a current channel. The two-dimensional electron gas 14 has a concentration of about $10^{13}$ cm$^{-2}$ in a portion parallel to the c-plane when the Al composition in the n$^+$-type AlGaN layer 6 is 20%, for example.

A source electrode 11 is formed in contact with the upper wall (upper surface) of the n$^+$-type AlGaN layer 6.

The source electrode 11 is so formed as to attain ohmic contact between the same and the n$^+$-type AlGaN layer 6, and electrically connected to the two-dimensional electron gas 14 through the n$^+$-type AlGaN layer 6 and the n$^-$-type GaN layer 5. The source electrode 11 can be constituted of a multilayer structure of Ti/Al (lower layer/upper layer), for example. When the lower layer of the multilayer structure is made of Ni, the source electrode 11 can be excellently brought into ohmic contact with the n$^+$-type AlGaN layer 6 by a treatment such as thermal alloying (annealing), for example.

A gate electrode 10 is formed on the −c-axis side inclined surface 9, a portion of the upper wall of the n$^+$-type AlGaN layer 6 opposed to the aperture 3 of the insulating film 2 and an edge portion of the insulating film 2 closer to the −c-axis side inclined surface 9, to be opposed thereto. The gate electrode 10 can be made of a conductive material such as Pt (platinum), Al (aluminum), Ni/Au (alloy of nickel and gold), Ni/Ti/Au (alloy of nickel, titanium and gold), Pd/Au (alloy of palladium and gold), Pd/Ti/Au (alloy of palladium, titanium and gold), Pd/Pt/Au (alloy of palladium, platinum and gold) or polysilicon, for example.

A drain electrode 12 is formed in contact with the back surface of the $n^+$-type GaN substrate 1 opposite to the principal plane 1$a$, to entirely cover the back surface. The drain electrode 12 is electrically connected with the $n^+$-type GaN substrate 1. The drain electrode 12 can be constituted of a multilayer structure of Ti/Al (layer closer to the $n^+$-type GaN substrate 1/layer farther from the $n^+$-type GaN substrate 1), for example.

A passivation film 13 made of SiN is formed on the surfaces of the nitride semiconductor multilayer structure portion 4 and the insulating film 2, to entirely cover these surfaces.

The operation of the CAVET is now described. In this CAVET, the sidewall on the −c-axis side of the $n^+$-type AlGaN layer 6 has the thickness of 10 nm to 30 nm, for example, whereby a depletion layer spreads from the gate electrode 10 up to a region shown by broken slant lines B in FIG. 1. Therefore, the part of the two-dimensional electron gas 14 closer to the −c-axis side inclined surface 9 is pinched off. Further, the distance L1 is larger than the distance L2 and the $n^-$-type GaN layer 5 is a high-resistance layer, whereby electrons in the part of the two-dimensional electron gas 14 closer to the +c-axis side inclined surface 8 do not move in the $n^-$-type GaN layer 5 to flow into $n^+$-type GaN substrate 1.

Therefore, the source and the drain are cutoff from each other. In order to operate the CAVET, a bias voltage positive on the drain side is applied between the source and the drain. In other words, a bias voltage of not less than a prescribed value (gate threshold voltage) positive with reference to the potential of the source electrode 11 is applied to the gate electrode 10 from this state, whereby the two-dimensional electron gas 14 is released from the pinch-off state, and a current flows in a direction shown by solid arrow D in FIG. 1. More specifically, the two-dimensional electron gas 14 released from the pinch-off state so moves that electrons reach a portion around an edge portion of the aperture 3 of the insulating film 2 closer to the −c-axis side inclined surface 9. The electrons reaching the portion around the edge portion of the aperture 3 of the insulating film 2 closer to the −c-axis side inclined surface 9 flow in the portion of the $n^-$-type GaN layer 5 located in the aperture 3 to flow into the $n^+$-type GaN substrate 1, due to the potential of the drain electrode 12.

Then, the electrons reach the drain electrode 12 through the $n^+$-type GaN substrate 1, to allow the source and the drain to conduct. Thus, the source and the drain are allowed to conduct when a bias voltage is applied to the gate electrode 10 while the source and the drain are cut off from each other when no bias voltage is applied to the gate electrode 10, to achieve a normally-off operation.

FIGS. 2A to 2D are schematic sectional views successively showing the steps for producing the CAVET shown in FIG. 1.

Figure 2A:
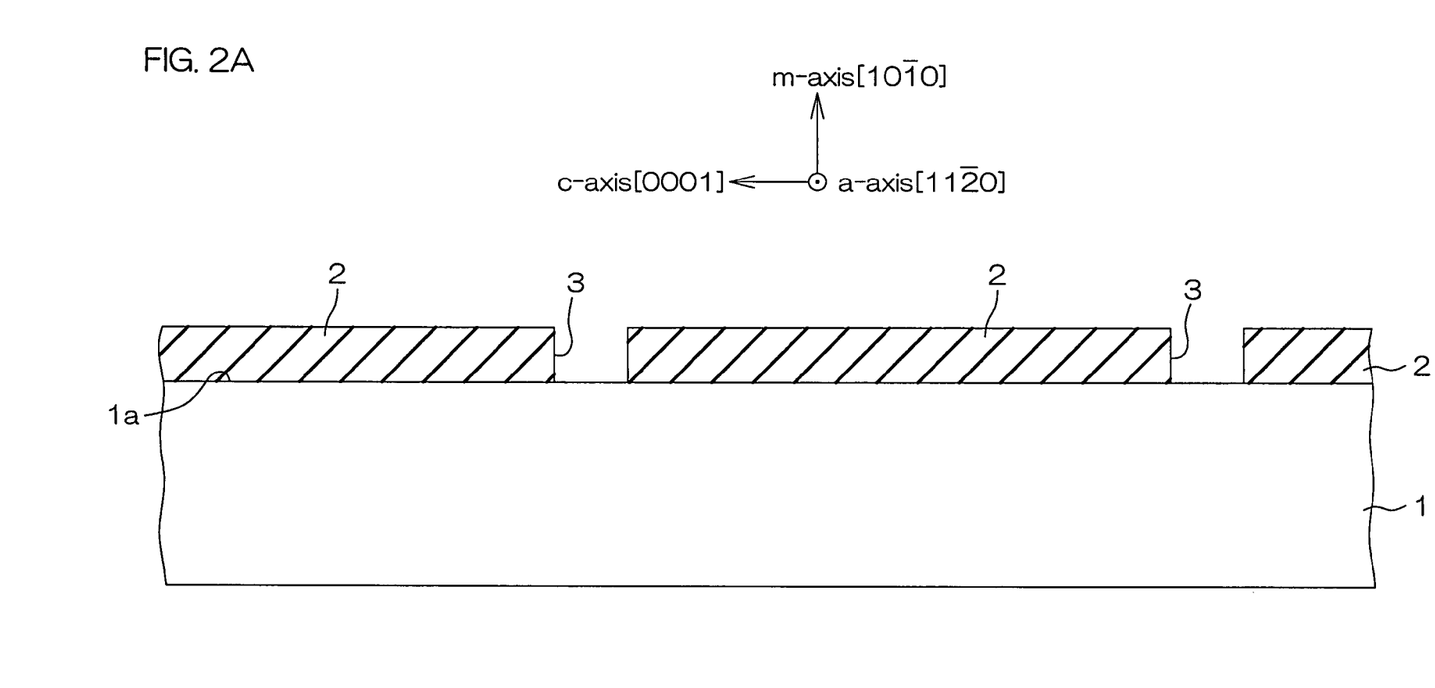
FIGS. 2A to 2D are schematic sectional views successively showing the steps for producing the CAVET shown in FIG. 1.

In order to produce this CAVET, an insulating film made of $SiO_2$ is first formed on the overall principal plane 1$a$ of the $n^+$-type GaN substrate 1 by PECVD (Plasma Enhanced Chemical Vapor Deposition), for example. Then, a photoresist film having an opening corresponding to the aperture 3 is formed on the insulating film by well-known photolithography. Then, the insulating film is dry-etched through the photoresist film serving as a mask, whereby the aperture 3 is formed in the insulating film and the insulating film 2 is formed as the stripes extending in the a-axis direction, as shown in FIG. 2A.

Then, group III nitride semiconductors are epitaxially grown from the principal plane 1$a$ of the $n^+$-type GaN substrate 1 partially exposed from the aperture 3 by the so-called ELO (Epitaxial Lateral Overgrowth).

The group III nitride semiconductors can be grown by MOCVD (Metal Organic Chemical Vapor Deposition), LPE (Liquid Phase Epitaxy), VPE (Vapor Phase Epitaxy), MBE (Molecular Beam Epitaxy) or the like, for example.

Figure 2B:
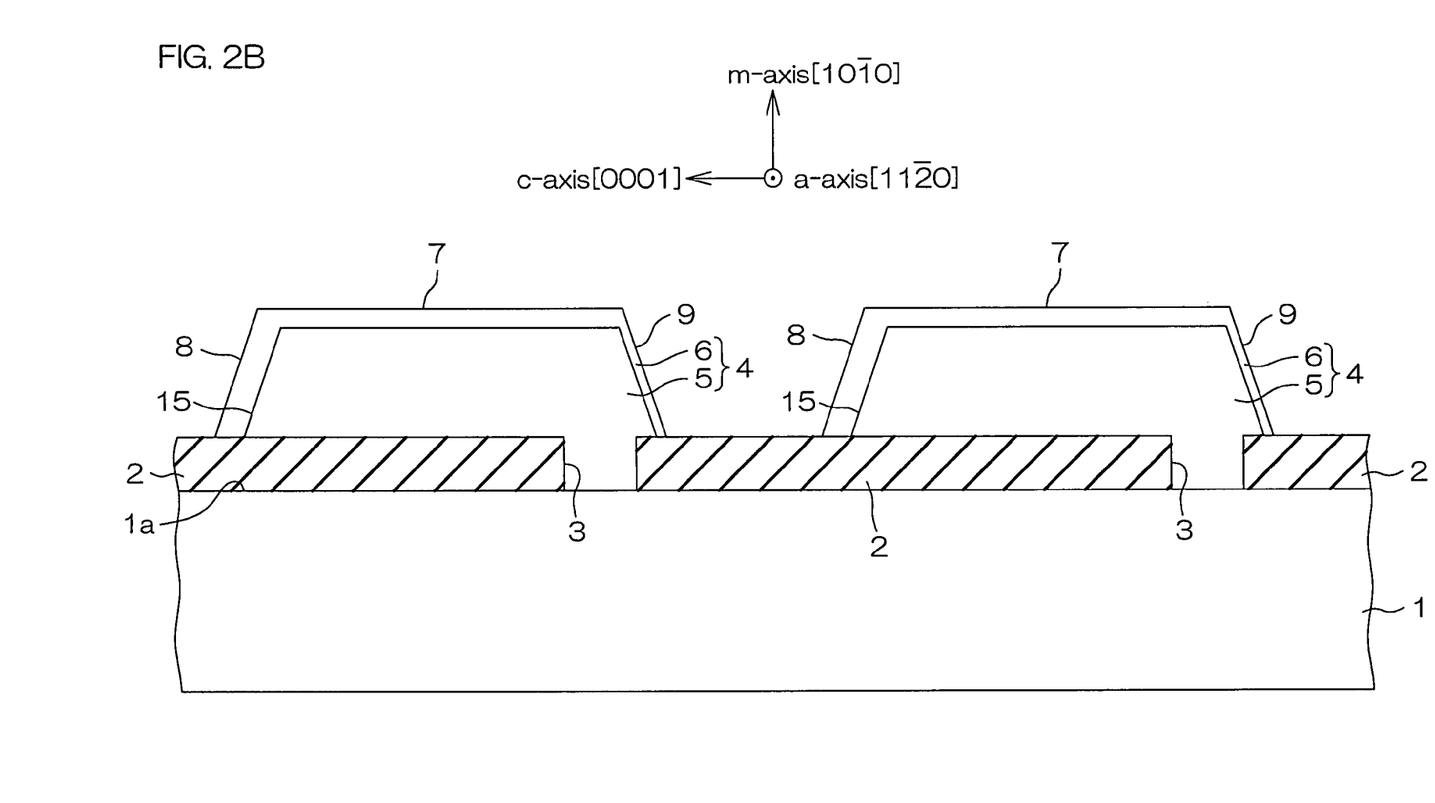

More specifically, $n^-$-type GaN is first grown from the principal plane 1$a$ of the $n^+$-type GaN substrate 1. This $n^-$-type GaN is first grown on the region in the aperture 3 of the insulating film 2 under conditions (growth temperature of 1000° C. to 1100° C. and growth pressure of 30 Torr to 300 Torr, for example) facilitating growth in the m-axis direction. Thereafter, the $n^-$-type GaN is grown on the region extending onto the insulating film 2 from the aperture 3 in the m-axis direction and the c-axis direction under conditions (growth temperature of 950° C. to 1050° C. and growth pressure of 300 Torr to 760 Torr, for example) facilitating growth in the c-axis direction. In the c-axis direction, $n^-$-type GaN is grown in the +c-axis direction and the −c-axis direction through the aperture 3 extending in the a-axis direction.

The growth of $n^-$-type GaN is continued until the grown $n^-$-type GaN is mesa-shaped in sectional view with an upper wall parallel to the principal plane 1$a$ of the $n^+$-type GaN substrate 1 and sidewalls of the +c-axis side and the −c-axis side inclined with respect to the principal plane 1$a$ on the region of the insulating film 2.

Thus, the $n^-$-type GaN layer 5 extending onto the insulating film 2 from the aperture 3 is formed as shown in FIG. 2B. Thereafter $n^+$-type AlGaN is grown from the surface of the $n^-$-type GaN layer 5. This $n^+$-type AlGaN is grown in the m-axis direction and the c-axis direction similarly to the $n^-$-type GaN, and the growth thereof is stopped when the grown $n^+$-type AlGaN is mesa-shaped in sectional view with an upper wall parallel to the principal plane 1$a$ of the $n^+$-type GaN substrate 1 and sidewalls of the +c-axis side and the −c-axis side inclined with respect to the principal plane 1$a$ on the region of the insulating film 2.

Thus, the $n^+$-type AlGaN layer 6 is formed on the $n^-$-type GaN layer 5, thereby forming the nitride semiconductor multilayer structure portion 4 having the parallel surface 7 parallel to the principal plane 1$a$ of the $n^+$-type GaN substrate 1, the +c-axis side inclined surface 8 and the −c-axis side inclined surface 9. Si, for example, may be employed as an n-type impurity for growing the $n^-$-type GaN and the $n^+$-type AlGaN.

Comparing the growth rates in the +c-axis direction and the −c-axis direction with each other in relation to epitaxy of a group III nitride semiconductor, the former is higher than the latter. On the region of the insulating film 2, therefore, the $n^-$-type GaN and the $n^+$-type AlGaN are grown up to positions farther from the aperture 3 in the +c-axis direction, as compared with the −c-axis direction. In the nitride semiconductor multilayer structure portion 4 formed by epitaxy, therefore, the portion of the interface 15 (GaN/AlGaN interface) between the $n^-$-type GaN layer 5 and the $n^+$-type AlGaN layer 6 on the −c-axis side can be positioned closer to the aperture 3 than the portion on the +c-axis side.

Figure 2C:
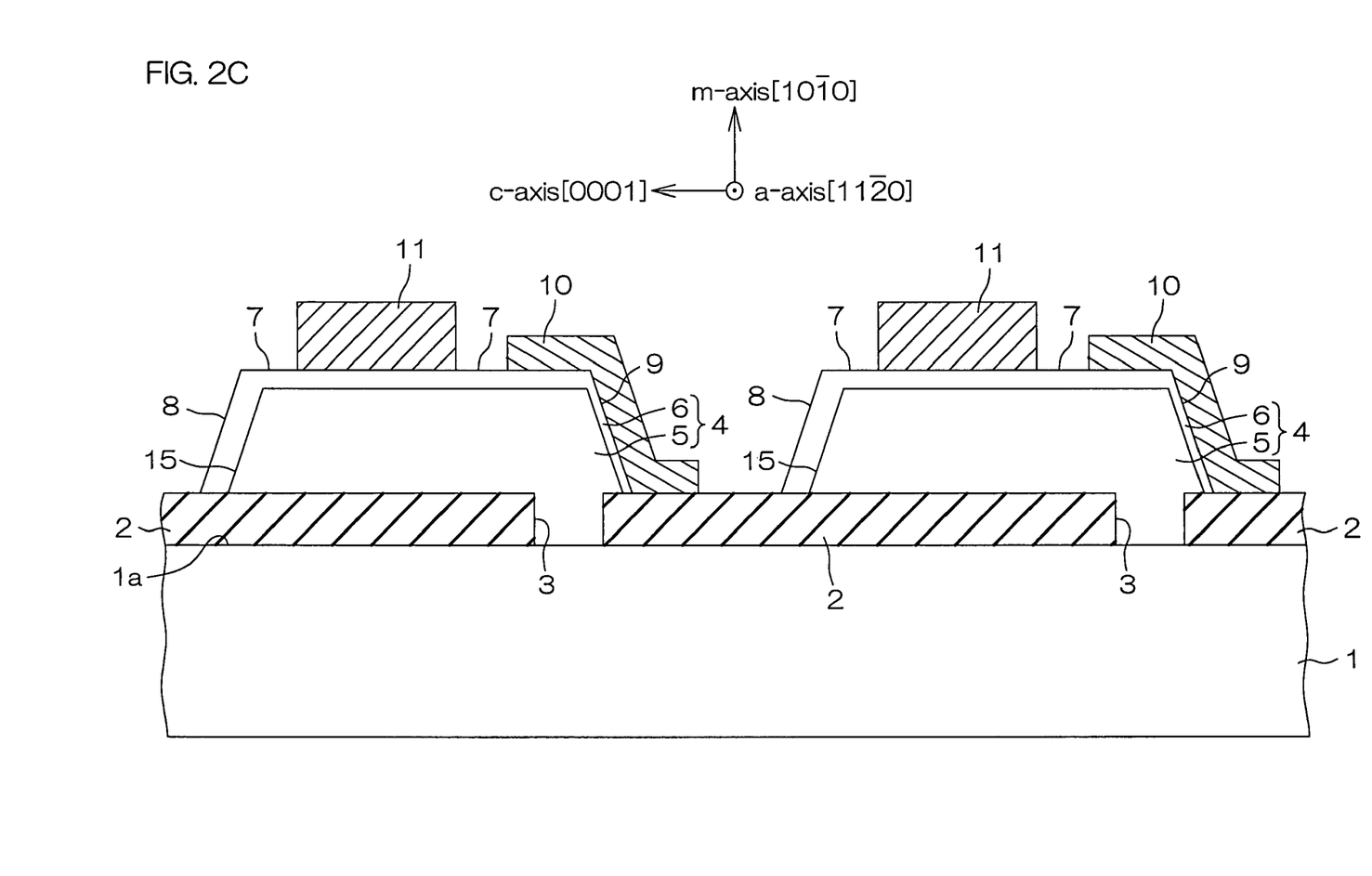

Then, the source electrode 11 is formed on the upper wall (upper surface) of the $n^+$-type AlGaN layer 6, as shown in FIG. 2C. In order to form the source electrode 11, a photoresist film (not shown) having an aperture in a region for forming the source electrode 11 is formed by well-known photolithography. Then, metals (Ti and Al, for example) employed as the materials for the source electrode 11 are sputtered from above this photoresist film in the order of Ti and Al. Thereafter the photoresist film is removed, thereby lifting off unnecessary portions (other than the source electrode 11) of the metals along with the photoresist film. The source electrode 11 is formed in contact with the upper wall (upper surface) of the n$^+$-type AlGaN layer 6 through these steps. After the formation of the source electrode 11, thermal alloying (annealing) is so performed that the source electrode 11 and the n$^+$-type AlGaN layer 6 are in ohmic contact with each other.

Then, a photoresist film (not shown) having an aperture in a region for forming the gate electrode 10 is formed by well-known photolithography. Then, a metal (the aforementioned conductive material, for example) employed as the material for the gate electrode 10 is sputtered from above this photoresist film. Thereafter the photoresist film is removed, thereby lifting off unnecessary portions (other than the gate electrode 10) of the metal along with the photoresist film. The gate electrode 10 opposed to the –c-axis side inclined surface 9, the portion of the upper wall of the n$^+$-type AlGaN layer 6 opposed to the aperture 3 of the insulating film 2 and the edge portion of the insulating film 2 closer to the –c-axis side inclined surface 9 is formed through these steps, as shown in FIG. 2C.

Thereafter an insulating film made of SiN is formed to cover the overall surface of the structure provided on the n$^+$-type GaN substrate 1. This insulating film is formed by ECR (Electron Cyclotron Resonance) sputtering, for example. Then, contact holes exposing the source electrode 11 and the gate electrode 10 respectively are formed in the insulating film. These contact holes are formed by dry etching with the aforementioned etching gas, for example. Due to the formation of these contact holes, the insulating film of SiN forms the passivation film 13 covering the overall surfaces of the nitride semiconductor multilayer structure portion 4 and the insulating film 2, as shown in FIG. 2D.

Figure 2D:
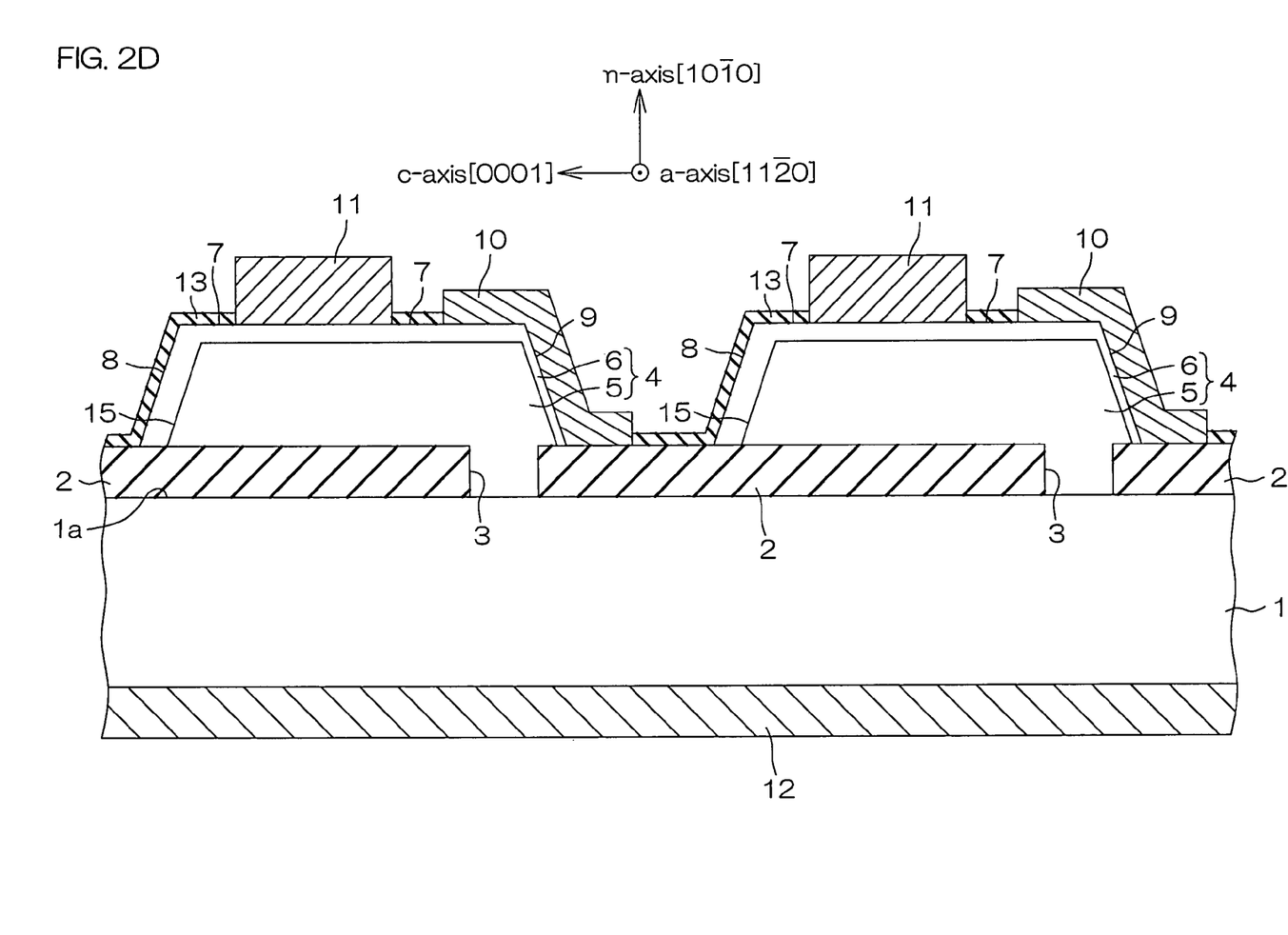

Then, the drain electrode 12 is formed in contact with the overall back surface of the n$^+$-type GaN substrate 1 opposite to the principal plane 1a, as shown in FIG. 2D. After the formation of the drain electrode 12, thermal alloying (annealing) is so performed that the drain electrode 12 and the n$^+$-type GaN substrate 1 are in ohmic contact with each other. The CAVET having the structure shown in FIG. 1 can be obtained in this manner. The two-dimensional electron gas 14 results from the heterojunction between the n$^-$-type GaN layer 5 and the n$^+$-type AlGaN layer 6, and hence the description thereof is omitted in relation to the steps shown in FIGS. 2A to 2D.

According to this embodiment, as hereinabove described, a CAVET capable of a normally-off operation can be implemented. Further, the principal plane 1a of the n$^+$-type GaN substrate 1 is defined by the m-plane (nonpolar plane), and hence threading dislocations (spiral dislocations, for example) in the c-axis direction present in the n$^+$-type GaN substrate 1 extend parallelly to the principal plane 1a. When the n$^-$-type GaN is grown in the m-axis direction in the region in the aperture 3 of the insulating film 2, therefore, transfer of the through locations from the n$^+$-type GaN substrate 1 to the n$^-$-type GaN can be suppressed. Therefore, the threading dislocations in the n$^+$-type GaN substrate 1 can be prevented from generating a leakage current flowing to the nitride semiconductor multilayer structure portion 4, whereby the device characteristics of the CAVET can be improved. Particularly when the principal plane 1a of the n$^+$-type GaN substrate 1 is defined by the m-plane as in this embodiment, transfer of the threading dislocations to the nitride semiconductor multilayer structure portion 4 can be further suppressed.

Further, the –c-axis side inclined surface 9 is defined by the semipolar plane such as (10-13), (10-11) or (11-22) inclined with respect to the principal plane 1a (m-plane) of the n$^+$-type GaN substrate 1. Therefore, the surface parallel to the –c-axis side inclined surface 9 is polarized. Thus, the part, serving as the current channel in this CAVET, of the two-dimensional electron gas 14 along the –c-axis side inclined surface 9 can be inhibited from reduction in electron density. Consequently, the CAVET can be inhibited from reduction in channel mobility.

In this CAVET, in addition, the passivation film 13 made of SiN is so formed as to cover the overall surfaces of the nitride semiconductor multilayer structure portion 4 and the insulating film 2. Thus, surface charge in the nitride semiconductor multilayer structure portion 4 can be suppressed by forming the passivation film 13 in contact with the surface of the nitride semiconductor multilayer structure portion 4. Consequently, the quantity of trap levels on the surface of the nitride semiconductor multilayer structure portion 4 can be reduced, whereby current collapse can be suppressed.

While the embodiment of the present invention has been described, the present invention may be embodied in other ways.

For example, the two-dimensional electron gas 14 may be formed on an i-type GaN layer containing no impurity, in place of the n$^-$-type GaN layer 5.

The nitride semiconductor multilayer structure portion 4 may not have the GaN/AlGaN interface, so far as the same includes two types of group III nitride semiconductor layers at least having different lattice constants with an interface forming the two-dimensional electron gas 14. The nitride semiconductor multilayer structure portion 4 may have the other layers of group III nitride semiconductor on two types of group III nitride semiconductor layers at least having different lattice constants with an interface.

The source electrode 11 may have another structure, so far as the same is electrically connected with the two-dimensional electron gas 14. When the nitride semiconductor multilayer structure portion 4 includes group III nitride semiconductor layers other than the n-type GaN layer 5 and the n$^+$-type AlGaN layer 6, for example, the source electrode 11 may be formed on either one of the upper walls (upper surfaces) of the group III nitride semiconductor layers parallel to the principal plane 1a of the n$^+$-type GaN substrate 1.

The gate electrode 10 may be formed through a gate insulating film made of SiN or the like. Thus, the CAVET has the so-called MIS (Metal Insulator Semiconductor) structure. When the CAVET has the MIS structure, surface charge (interface charge) around the interface between the nitride semiconductor multilayer structure portion 4 and SiN can be suppressed, whereby current collapse as well as generation of a leakage current can be suppressed.

The n$^+$-type GaN substrate 1 may be replaced with a substrate such as an InN (nitride indium) substrate, for example, consisting of a conductive group III nitride semiconductor.

The –c-axis side inclined surface 9 can be defined by a –c-plane by employing an n$^+$-type GaN substrate having a principal plane defined by a semipolar plane and growing a group III nitride semiconductor from this principal plane. When the –c-axis side inclined surface 9 is defined by a –c-plane, the electron density of the part of the two-dimensional electron gas 14 along the –c-axis side inclined surface 9 can be more increased, whereby a CAVET having excellent channel mobility can be implemented.

In the n$^+$-type AlGaN layer 6, the Al composition may be uniform, or portions having different Al compositions may be distributed.

While the present invention has been described in detail by way of the embodiments thereof, it should be understood that these embodiments are merely illustrative of the technical principles of the present invention but not limitative of the invention. The spirit ad scope of the present invention are to be limited only by the appended claims.

This application corresponds to Japanese Patent Application No. 2007-208389 filed in the Japanese Patent Office on Aug. 9, 2007, the disclosure of which is incorporated herein by reference in its entirety.

What is claimed is:

1. A nitride semiconductor device comprising:
a semiconductor base layer made of a conductive group III nitride semiconductor having a principal plane defined by an m-plane or an a-plane;
an insulating layer formed on the principal plane of the semiconductor base layer with an aperture partially exposing the principal plane;
a nitride semiconductor multilayer structure portion, formed on a region extending onto the insulating layer from the aperture, having a surface that includes a parallel surface parallel to the principal plane of the semiconductor base layer, and a +c-axis side first inclined surface and a −c-axis side second inclined surface inclined with respect to the principal plane of the semiconductor base layer, the nitride semiconductor multilayer structure portion including two types of group III nitride semiconductor layers each having different lattice constants;
a gate electrode formed on and to be opposed to the second inclined surface;
a source electrode arranged to be electrically connected with the group III nitride semiconductor layers; and
a drain electrode formed on a back surface of the semiconductor base layer opposite to the principal plane.

2. The nitride semiconductor device according to claim 1, wherein the semiconductor base layer includes an m-plane GaN substrate having a principal plane defined by the m-plane or an a-plane GaN substrate having a principal plane defined by the a-plane.

3. The nitride semiconductor device according to claim 2, further including a passivation film made of SiN formed in contact with the surface of the nitride semiconductor multilayer structure portion.

4. The nitride semiconductor device according to claim 2, wherein SiN is interposed between the second inclined surface and the gate electrode.

5. The nitride semiconductor device according to claim 1, wherein the second inclined surface is defined by a −c-plane.

6. The nitride semiconductor device according to claim 5, further including a passivation film made of SiN formed in contact with the surface of the nitride semiconductor multilayer structure portion.

7. The nitride semiconductor device according to claim 5, wherein SiN is interposed between the second inclined surface and the gate electrode.

8. The nitride semiconductor device according to claim 1, further including a passivation film made of SiN formed in contact with the surface of the nitride semiconductor multilayer structure portion.

9. The nitride semiconductor device according to claim 8, wherein SiN is interposed between the second inclined surface and the gate electrode.

10. The nitride semiconductor device according to claim 1, wherein SiN is interposed between the second inclined surface and the gate electrode.

11. The nitride semiconductor device according to claim 1, wherein a portion of the interface between the two types of group III nitride semiconductor layers at least having different lattice constants parallel to the second inclined surface is positioned closer to the aperture than a portion, included in the interface, parallel to the first inclined surface.

12. The nitride semiconductor device according to claim 1, wherein
the nitride semiconductor multilayer structure portion has a mesa shape including an upper wall parallel to the principal plane of the semiconductor base layer and sidewalls of a +c-axis side and a −c-axis side inclined with respect to the principal plane of the semiconductor base layer, and
the surface of the upper wall forms the parallel surface, the surface of the sidewall of the +c-side side forms the first inclined surface, and the surface of the sidewall of the −c-axis side forms the second inclined surface.

13. The nitride semiconductor device according to claim 1, wherein the two types of group III nitride semiconductor layers at least having different lattice constants are in a multilayer structure of an $n^-$-type GaN layer provided on the side of the semiconductor base layer and an $n^+$-type AlGaN layer having a different lattice constant from the $n^-$-type GaN layer.

14. The nitride semiconductor device according to claim 1, wherein the insulating layer is made of an oxide, a nitride or an oxynitride.

15. The nitride semiconductor device according to claim 1, wherein
the source electrode is formed on the outermost layer of the nitride semiconductor multilayer structure portion, and
a surface of the outermost layer provided with the source electrode forms the parallel surface.

16. A method for producing a nitride semiconductor device, comprising the steps of:
forming an insulating layer having an aperture partially exposing a principle plane of a semiconductor base layer on the principle plane, defined by an m-plane or an a-plane, of the semiconductor base layer made of a conductive group III nitride semiconductor;
forming a nitride semiconductor multilayer structure portion on a region extending onto the insulating layer from the aperture, the nitride semiconductor multilayer structure portion having a surface that includes a parallel surface parallel to the principle plane of the semiconductor base layer, and a +c-axis side first inclined surface and a −c-axis side second inclined surface inclined with respect to the principal plane of the semiconductor base layer, the nitride semiconductor multilayer structure portion including two types of group III nitride semiconductor layers each having different lattice constants;
forming a gate electrode to be opposed to the second inclined surface;
forming a source electrode to be electrically connected with the group III nitride semiconductor layers; and
forming a drain electrode on a back surface of the semiconductor base layer opposite to the principal plane.

* * * * *